(12) United States Patent
Lee

(10) Patent No.: US 7,242,081 B1
(45) Date of Patent: Jul. 10, 2007

(54) STACKED PACKAGE STRUCTURE

(75) Inventor: Yonggill Lee, Kaohsiung (TW)

(73) Assignee: Advanced Semiconductor Engineering Inc., Kaohsiung (TW)

( * ) Notice: Subject to any disclaimer, the term of this patent is extended or adjusted under 35 U.S.C. 154(b) by 0 days.

(21) Appl. No.: 11/409,933

(22) Filed: Apr. 24, 2006

(51) Int. Cl.
*H01L 23/02* (2006.01)

(52) U.S. Cl. ............................ 257/686; 257/E25.013
(58) Field of Classification Search ......... 257/686, 257/685
See application file for complete search history.

(56) References Cited

U.S. PATENT DOCUMENTS

| | | | |
|---|---|---|---|
| 5,883,426 A * | 3/1999 | Tokuno et al. | 257/686 |
| 6,101,100 A * | 8/2000 | Londa | 361/761 |
| 6,740,964 B2 * | 5/2004 | Sasaki | 257/687 |
| 7,049,692 B2 * | 5/2006 | Nishimura et al. | 257/686 |
| 2004/0080036 A1 * | 4/2004 | Chang et al. | 257/686 |
| 2006/0180911 A1 * | 8/2006 | Jeong et al. | 257/686 |

* cited by examiner

*Primary Examiner*—Leonardo Andujar
*Assistant Examiner*—Krista Soderholm
(74) *Attorney, Agent, or Firm*—Thomas, Kayden, Horstemeyer & Risley

(57) ABSTRACT

A stacked package structure and a method for manufacturing the same are disclosed. The package structure comprises: a substrate having a first surface and a second surface in opposition to each other; at least one chip deposed on and electrically connected to the first surface of the substrate; a plurality of electrical connection devices deposed on the first surface and periphery of the substrate, wherein each electrical connection device is higher than the at least one chip in altitude; and an encapsulant covering the first surface of the substrate, the at least one chip and the electrical connection devices, wherein a top end of each electrical connection device is exposed at a surface of the encapsulant.

10 Claims, 10 Drawing Sheets

STACKED PACKAGE STRUCTURE

FIELD OF THE INVENTION

The present invention relates to a system-in-package (SiP) structure and a method for manufacturing the same, and more particularly, to a stacked package structure and a method for manufacturing the same.

BACKGROUND OF THE INVENTION

The demand for low cost, small size, and more functionality has become the main driving force in the electronic industry. To achieve such goals, advanced packaging techniques like flip chip, chip scale package, wafer level packaging, and 3D packages have been developed. The 3D packaging technique is developed to integrate dies, packages and passive components into one package, in other words, to achieve system in a package solution. The integration can be made in side-by-side, stacked, or both manners. The outstanding advantages of 3D package are small footprint, high performance and low cost.

FIGS. 1 to 3 are schematic flow diagrams showing the process for manufacturing a conventional stacked package structure. In the fabrication of a conventional stacked package structure 250, a chip package structure 100 is firstly provided typically, in which the chip package structure 100 is generally a chip scale package (CSP). The chip package structure 100 mainly includes a substrate 102, a chip 104, an encapsulant 108 and bumps 110, such as shown in FIG. 1. The chip 104 is attached on a top surface 112 of the substrate 102, and is electrically connected to pads (not shown) of the substrate 102 by wires 106. The encapsulant 108 is formed on the top surface 112 of the substrate 102 and fully covers the chip 104, the wires 106 and the top surface 112 of the substrate 102. The bumps 110 are set on the outer portion of a bottom surface 114 of the substrate 102, in which the bumps 110 are electrically connected to the chip 104.

Next, another chip package structure 200 is provided, in which the chip package structure 200 is mainly composed of a substrate 202, a chip 204, an encapsulant 208 and bumps 210, such as shown in FIG. 2. The chip 204 is attached on a top surface 212 of the substrate 202, and is electrically connected to pads (not shown) of the substrate 202 by wires 206. The encapsulant 208 is formed on a portion of the top surface 212 of the substrate 202 and fully covers the chip 204 and the wires 206. The bumps 210 are set on a bottom surface 214 of the substrate 202, in which the bumps 210 are electrically connected to the chip 204. The top surface 212 of the substrate 202 of the chip package structure 200 further includes a plurality of connection pads 216 deposed thereon, in which the locations of the connection pads 216 are corresponding to that of the bumps 110 on the bottom surface 114 of the substrate 102.

Then, the chip package structure 100 is stacked on the chip package structure 200, and the bumps 110 of the chip package structure 100 are respectively connected to the corresponding connection pads 216. Subsequently, a reflow step is performed, so as to connect the bumps 110 of the chip package structure 100 to the connection pads 216 of the chip package structure 200 to complete the stacked package structure 250.

However, in the connection treatment of the chip package structure 100 and the chip package structure 200, warpage will occur in the chip package structure 100 and the chip package structure 200, especially the chip package structure 100. Furthermore, the room between the substrate 102 of the chip package structure 100 and the substrate 202 of the chip package structure 200 is still large, and the connection locations between the chip package structure 100 and the chip package structure 200 are at the outer region, so that a cold joint occurs between the chip package structure 100 and the chip package structure 200. As a result, the reliability of the stacked package structure is seriously deteriorated, the yield of the package process is greatly reduced, and the cost is substantially increased.

SUMMARY OF THE INVENTION

Therefore, one objective of the present invention is to provide a stacked package structure, which can reduce the area occupied by the package structure to greatly decrease the area of a printed circuit board.

Another objective of the present invention is to provide a method for manufacturing a stacked package structure, which can integrate the connection between an upper chip package structure and a bottom chip package structure.

Still another objective of the present invention is to provide a method for manufacturing a stacked package structure, which can effectively avoid warpage from occurring in the connection of chip package structures, and prevent a cold joint condition from occurring between the chip package structures, so as to greatly enhance the yield of the stacked package structure.

According to the aforementioned objectives, the present invention provides a stacked package structure, comprising a first chip package structure, a second chip package structure and a plurality of first connection bumps. The first chip package structure comprises: a first substrate, having a first surface and a second surface in opposition to each other; at least one first chip deposed on the first surface of the first substrate; a plurality of first electrical connection devices deposed on the first surface of the first substrate around the at least one first chip, in which each first electrical connection device is higher than the at least one first chip in altitude; a first encapsulant covering the first surface of the first substrate, the at least one first chip and the first electrical connection devices, in which a top end of each first electrical connection device is exposed at a surface of the first encapsulant; and a plurality of bumps deposed on the second surface of the first substrate, in which the at least one first chip and the first electrical connection devices are electrically connected to the bumps respectively. The second chip package structure is stacked on the first chip package structure and comprises: a second substrate, having a first surface and a second surface in opposition to each other; at least one second chip deposed on the first surface of the second substrate; a plurality of second electrical connection devices deposed on the first surface of the second substrate around the at least one second chip, in which each second electrical connection device is higher than the at least one second chip in altitude; and a second encapsulant covering the first surface of the second substrate, the at least one second chip and the second electrical connection devices, in which a top end of each second electrical connection device is exposed at a surface of the second encapsulant. The first connection bumps are respectively deposed on the top end of each first electrical connection device, and are jointed with the second surface of the second substrate, in which the at least one second chip and the second electrical connection devices are electrically connected to the first connection bumps respectively.

According to the aforementioned objectives, the present invention provides a package structure, comprising: a substrate having a first surface and a second surface in opposition to each other; at least one chip deposed on and electrically connected to the first surface of the substrate; a plurality of electrical connection devices deposed on the first surface of the substrate, wherein each electrical connection device is higher than the at least one chip in altitude; an encapsulant covering the first surface of the substrate, the at least one chip and the electrical connection devices, wherein a top end of each electrical connection device is exposed at a surface of the encapsulant; and a plurality of connections respectively deposed on the top end of each electrical connection device.

According to the aforementioned objectives, the present invention provides a method for manufacturing a package structure, comprising: providing a substrate having a first surface and a second surface in opposition to each other, wherein a plurality of electrical connection devices are formed on the first surface of the substrate; providing at least one chip on and electrically connected to the first surface of the substrate, wherein each the electrical connection device is higher than the at least one chip in altitude; forming an encapsulant covering the first surface of the substrate, the at least one chip and the electrical connection devices, wherein a top end of each electrical connection device is exposed at a surface of the encapsulant; and forming a plurality of connections respectively deposed on the top end of each first electrical connection device.

According to the aforementioned objectives, the present invention further provides a method for manufacturing a stacked package structure, comprising the following steps. Firstly, a first chip package structure is formed, and the step of forming of the first chip package structure comprises: providing a first substrate, having a first surface and a second surface in opposition to each other, in which an outer region of the first surface of the first substrate includes a plurality of first electrical connection devices formed thereon; providing at least one first chip on a central region of the first surface of the first substrate, in which each first electrical connection device is higher than the at least one first chip in altitude; next, forming a first encapsulant covering the first surface of the first substrate, the at least one first chip and the first electrical connection devices, in which a top end of each first electrical connection device is exposed at a surface of the first encapsulant; subsequently, forming a plurality of bumps deposed on the second surface of the first substrate, in which the at least one first chip and the first electrical connection devices are electrically connected to the bumps respectively. Then, a second chip package structure is formed, and the step of forming of the second chip package structure comprises: providing a second substrate, having a first surface and a second surface in opposition to each other, in which an outer region of the first surface of the second substrate includes a plurality of second electrical connection devices formed thereon; providing at least one second chip on a central region of the first surface of the second substrate, in which each second electrical connection device is higher than the at least one second chip in altitude; subsequently, forming a second encapsulant covering the first surface of the second substrate, the at least one second chip and the second electrical connection devices, in which a top end of each second electrical connection device is exposed at a surface of the second encapsulant. Then, a plurality of connection bumps are respectively formed on the top end of each first electrical connection device. After that, the second chip package structure is stacked on the first chip package structure, in which the second surface of the second substrate is jointed with the connection bumps, and the at least one second chip and the second electrical connection devices are electrically connected to the connection bumps respectively.

According to a preferred embodiment of the present invention, the first electrical connection devices and the second electrical connection devices can be wires, conductive studs, pins, electronic components or any combination of the aforementioned devices.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

The present invention discloses a stacked package structure and a method for manufacturing the same. In order to make the illustration of the present invention more explicit and complete, the following description is stated with reference to FIGS. 4 to 12c.

Figure 1:
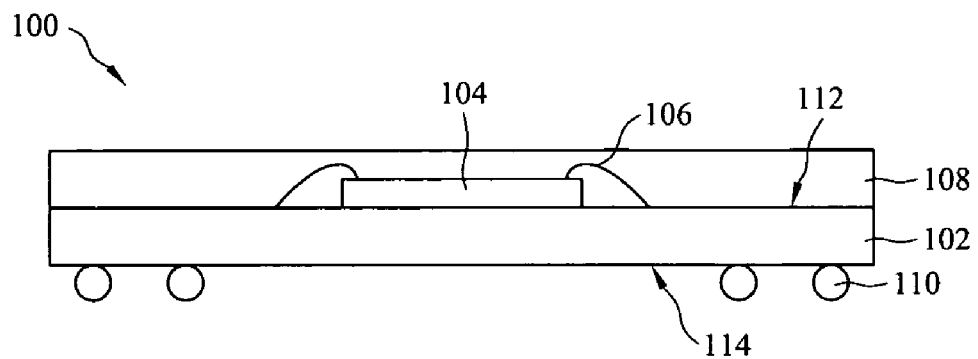
FIGS. 1 to 3 are schematic flow diagrams showing the process for manufacturing a conventional stacked package structure.
Figure 2:
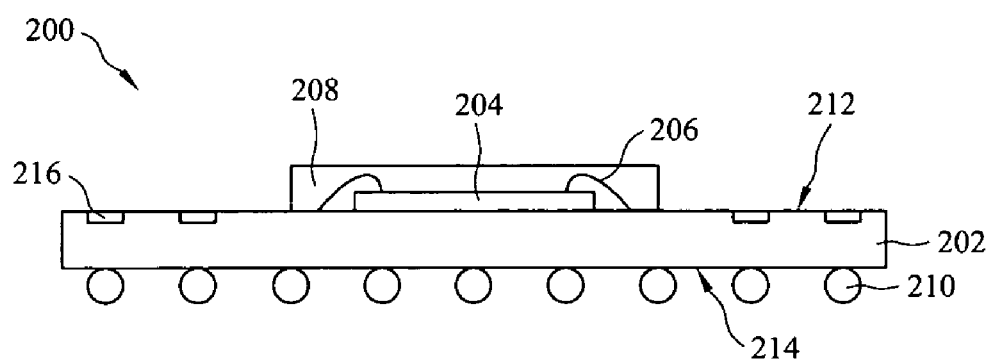
Figure 3:
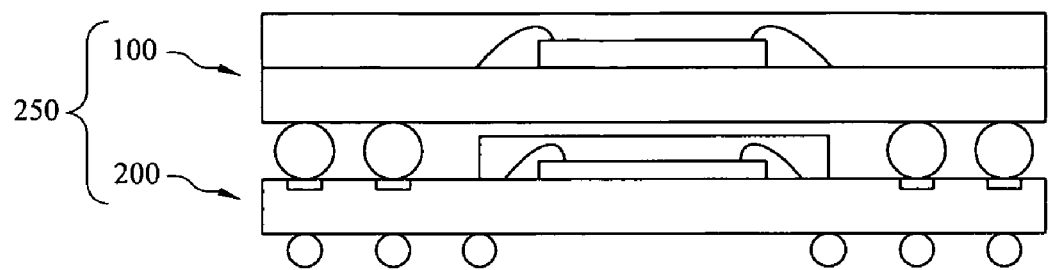
Figure 4:
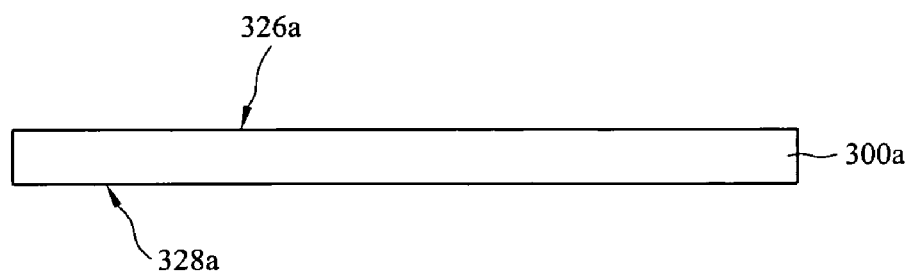
FIGS. 4 to 9b are schematic flow diagrams showing the process for manufacturing a stacked package structure in accordance with a first preferred embodiment of the present invention.
Figure 7A:
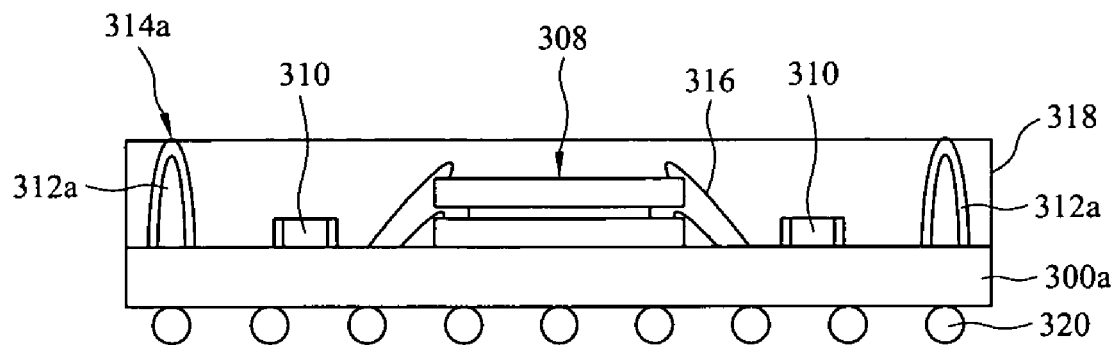
Figure 7B:
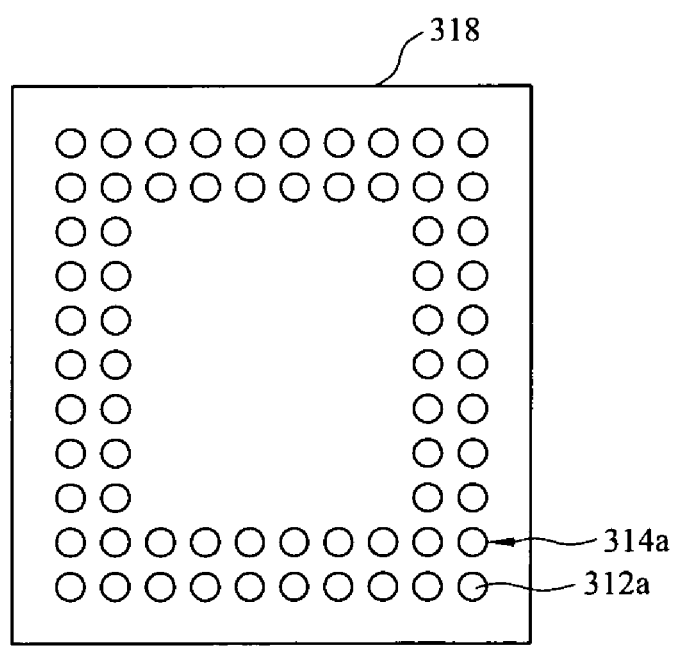
Figure 7C:
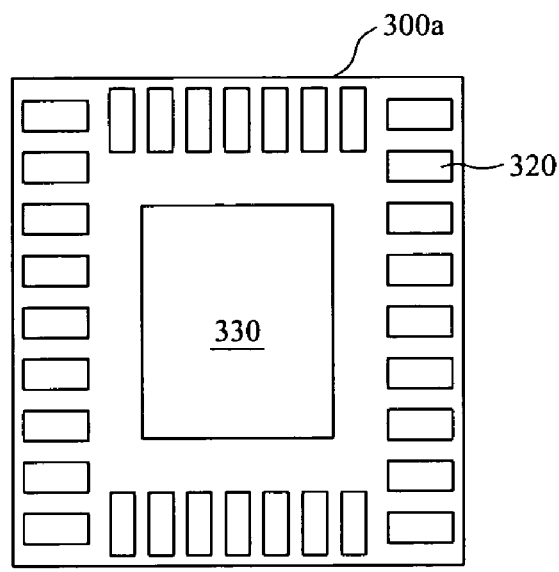
Figure 8:
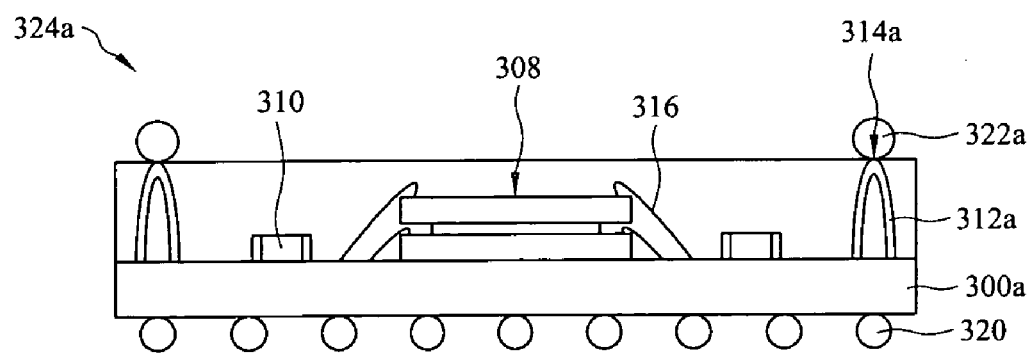
Figure 12A:
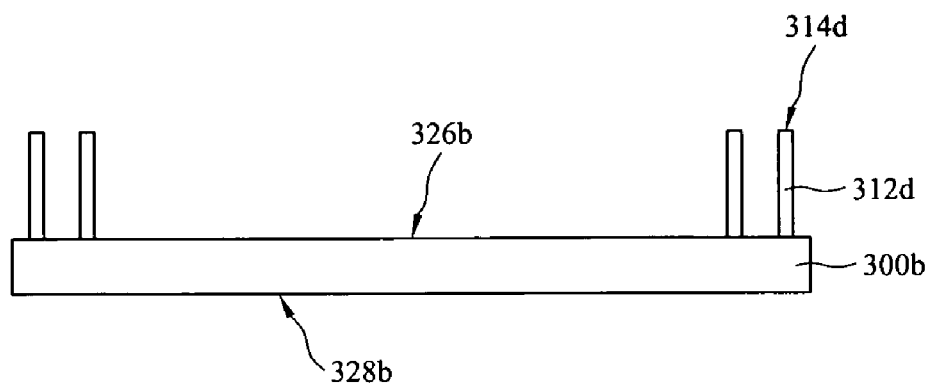
FIG. 12a is a cross-sectional view of a substrate of a stacked package structure in accordance with a fourth preferred embodiment of the present invention.

Referring to FIGS. 4 to 9b and FIG. 12a, in which FIGS. 4 to 9b are schematic flow diagrams showing the process for manufacturing a stacked package structure in accordance with a first preferred embodiment of the present invention. In the fabrication of a stacked package structure of the present invention, a chip package structure 324a, such as illustrated in FIG. 8, is typically formed firstly. In the formation of the chip package structure 324a, a substrate 300a or a substrate 300b is provided, in which the substrate 300a or the substrate 300b may be a printed circuit board, for example. The substrate 300a has a surface 326a and a surface 328a in opposition to each other, while the substrate 300b has a surface 326b and a surface 328b in opposition to each other. It should be noted that when the substrate 300b is provided by a supplier, a plurality of electrical connection devices 312d have already been set on the surface 326b, such as shown in FIG. 12a, the connection devices 312d are preferably deposed on the periphery of the substrate 326b; when the substrate 300a is provided by a supplier, no device is set on the opposite surface 326a and the surface 328a, such as shown in FIG. 4. In the present embodiment, the chip package structure 324a is fabricated on the substrate 300a.

Figure 5:
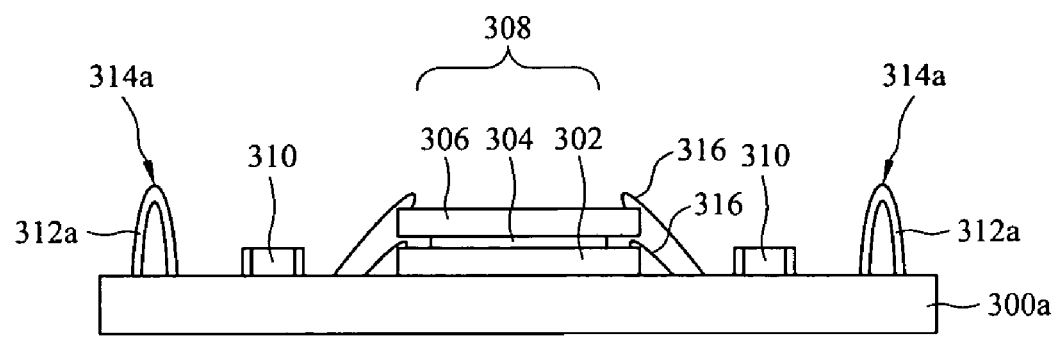

Next, a chip structure 308 is attached to a central region of the surface 326a of the substrate 300a, and several wires 316 are formed to connect the chip structure 308 and pads (not shown) at the surface 326a of the substrate 300a by, for example, a wire bonding method, so as to electrically connect the chip structure 308 and the substrate 300a. The passive devices 310 according to the requirements are provided and attached to the surface 326a of the substrate 300a at the periphery of the chip structure 308, in which the passive devices 310 may be resistors, inductors or capacitors, for example. In the present embodiment, the chip structure 308 is a multi-chip structure including a chip 302 and a chip 306, in which the chip 302 and the chip 306 can be jointed by an adhesion layer 304, and a material of the adhesion layer 304 can be, for example, epoxy. However, it is worthy of note that the chip structure of the present invention may be composed of a single chip. A plurality of electrical connection devices 312a are formed in the outer region of the surface 326a of the substrate 300a, in which the electrical connection devices 312a are preferably located at the periphery of the chip structure 308 and the passive devices 310, such as shown in FIG. 5. The electrical connection devices 312a must be higher than the chip structure 308 in altitude. The electrical connection devices 312a in the present embodiment are wires.

Figure 10A:
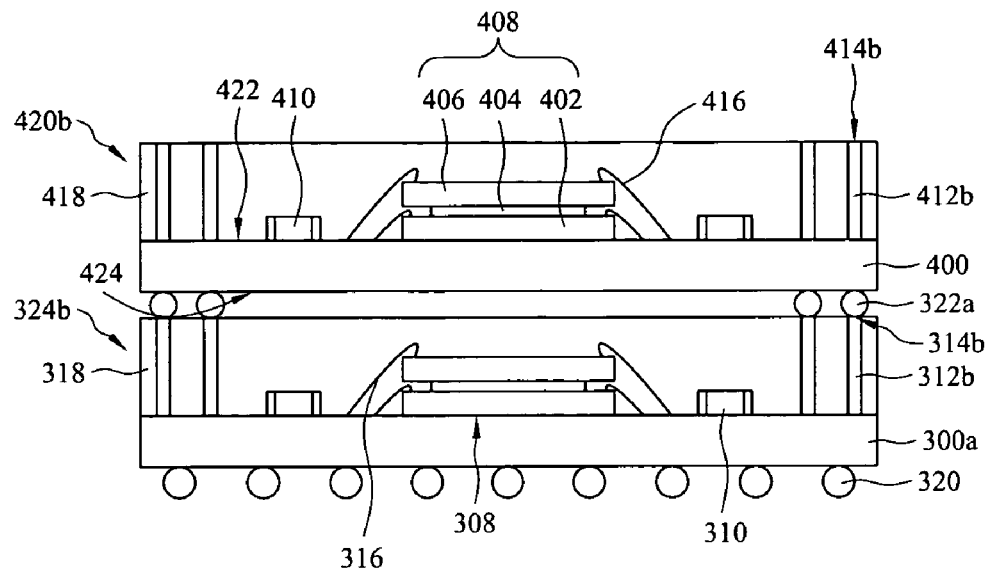
FIGS. 10a and 10b are cross-sectional views of a stacked package structure in accordance with a second preferred embodiment of the present invention.
Figure 11A:
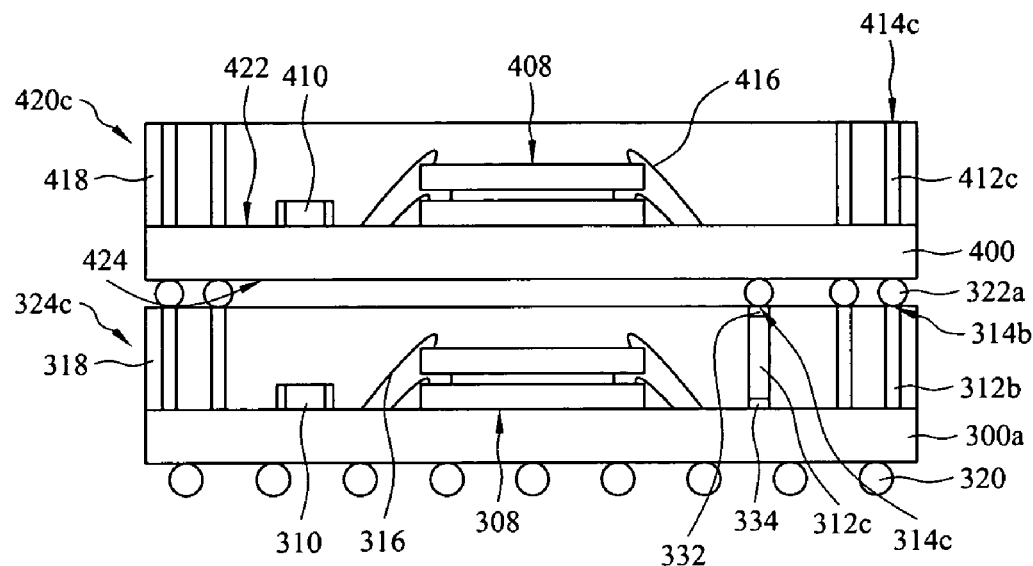
FIGS. 11a and 11b are cross-sectional views of a stacked package structure in accordance with a third preferred embodiment of the present invention.

However, in the other embodiments of the present invention, various types of electrical connection devices, such as electrical connection devices 312b shown in FIG. 10a, electrical connection devices 312c shown in FIG. 11a and electrical connection devices 312d shown in FIG. 12a, may be used, in which the electrical connection devices 312b are conductive studs, the electrical connection devices 312c are electronic components, such as passive devices, and the electrical connection devices 312d are pins. Furthermore, note that the electrical connection devices of the stacked package structure in the present invention can be any combination of the electrical connection devices in the aforementioned embodiments, such as a chip package structure 324c in FIG. 11a. In the present invention, the electrical connection devices 312a, the electrical connection devices 312b and the electrical connection devices 312d may be composed of Au, Al, Cu, Sn and the alloys thereof, for example. The electrical connection devices 312a, the electrical connection devices 312b, the electrical connection devices 312c and the electrical connection devices 312d can be respectively attached to the surface 326a of the substrate 300a by an adhesion material, such as solder or an alloy of the solder.

Figure 6:
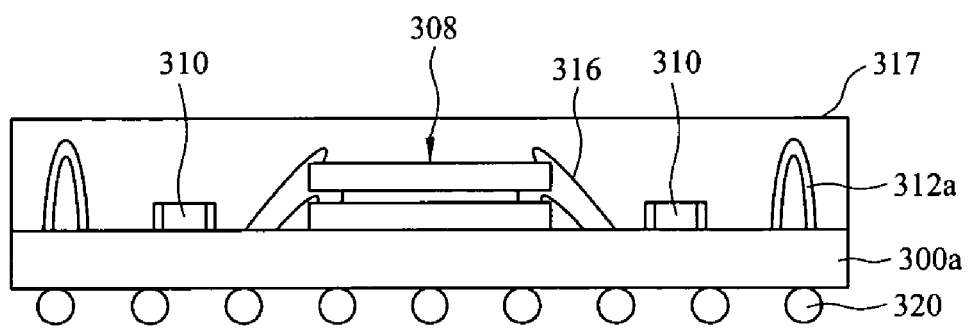

Next, such as shown in FIG. 6, an encapsulant material layer 317 is formed to cover the surface 326a of the substrate 300a, and wrap the chip structure 308, the wires 316, the passive devices 310 and the electrical connection devices 312a on the surface 326a of the substrate 300a by, for example, a molding or coating method. A plurality of bumps 320 are formed to joint on the outer region of the surface 328a of the substrate 300a, and a heat sink 330 is preferably formed on a central region of the surface 328a of the substrate 300a for dissipating heat, such as shown in FIG. 7c. The chip structure 308 and the electrical connection devices 312a are electrically connected to the bumps respectively. Subsequently, the encapsulant material layer 317 is ground to remove a portion of the encapsulant material layer 317 by a mechanical method or a chemical method, until the top end 314a of each electrical connection device 312a is exposed, so as to form an encapsulant 318, such as shown in FIG. 7a.

After the encapsulant 318 is formed, several connection bumps 322a are formed and respectively attached on the top end 314a of each electrical connection device 312a, so as to complete the chip package structure 324a, such as shown in FIG. 7b. The connection bumps 322a can be formed by a direct ball attach method, a screen print method, an electro plating method or an electroless plating method.

Figure 9A:
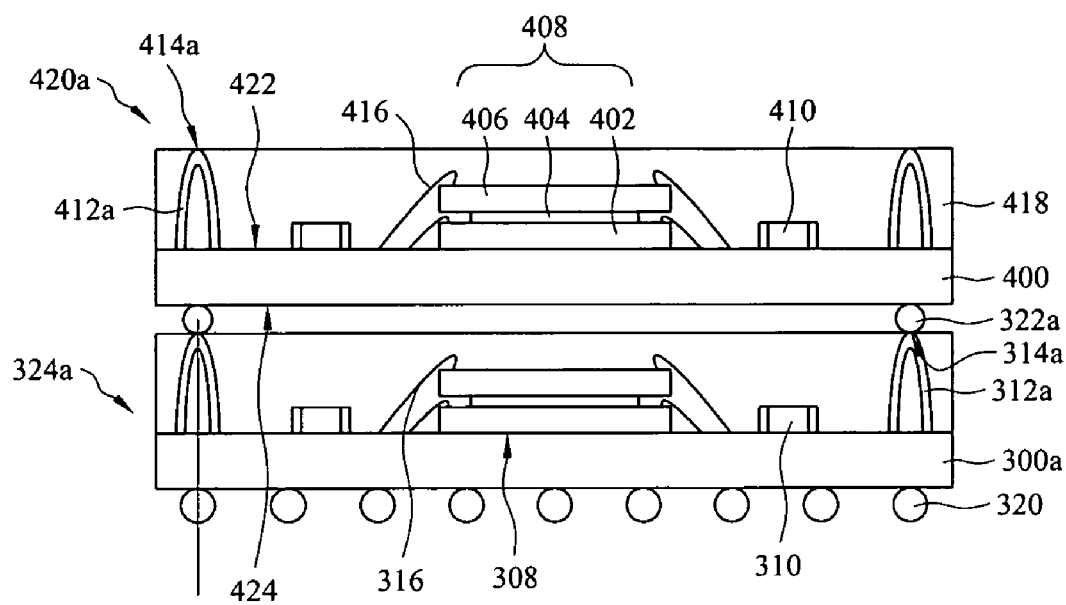

A chip package structure 420a is formed by a method similar to the method for manufacturing the chip package structure 324a. The chip package structure 420a is mainly composed of a substrate 400, a chip structure 408 and electrical connection devices 412a. The substrate 400 has a surface 422 and a surface 424 in opposition to each other. A chip structure 408 is attached to a central region of the surface 422 of the substrate 400, and several wires 416 are formed to connect the chip structure 408 and pads (not shown) at the surface 422 of the substrate 400 by, for example, a wire bonding method, so as to electrically connect the chip structure 408 and the substrate 400. In the present embodiment, the chip structure 408 is a multi-chip structure including a chip 402 and a chip 406, in which the chip 402 and the chip 408 can be jointed by an adhesion layer 404, and a material of the adhesion layer 404 can be, for example, epoxy. It is worthy of note that the chip structure of the present invention may be composed of a single chip. A plurality of electrical connection devices 412a are formed in the outer region of the surface 422 of the substrate 400. In a preferred embodiment of the present invention, the passive devices 410 according to the requirements are provided and attached to the surface 422 of the substrate 400 at the periphery of the chip structure 408, in which the passive devices 410 may be resistors, inductors or capacitors, for example. The electrical connection devices 412a are preferably located at the periphery of the chip structure 408 and the passive devices 410, and the electrical connection devices 412a must be higher than the chip structure 408 in altitude, such as shown in FIG. 9a. The electrical connection devices 412a in the present embodiment are wires. However, various types of electrical connection devices, such as conductive studs, electronic components, pins or any combination of the aforementioned electrical connection devices, may be used. The electrical connection devices 412a may be composed of Au, Al, Cu, Sn and the alloys thereof, for example, the electrical connection devices 412a can be respectively attached to the surface 422 of the substrate 400 by an adhesion material, such as solder or an alloy of the solder. An encapsulant material layer (not shown) is formed to cover the surface 422 of the substrate 400, and wrap the chip structure 408, the wires 416, the passive devices 410 and the electrical connection devices 412a on the surface 422 of the substrate 400 by a molding or coating method. Then, a portion of the encapsulant material layer is removed by a mechanical grinding method or a chemical grinding method, until the top end 414a of each electrical connection device 412a is exposed, so as to form an encapsulant 418 and complete the chip package structure 420a. Subsequently, the chip package structure 420a is stacked and jointed on the chip package structure 324a, in which the surface 424 of the substrate 400 is jointed with the connection bumps 322a, and the chip structure 408 and the electrical connection devices 412a are electrically connected to the connection bumps 322a respectively, so that a stacked package structure, such as shown in FIG. 9a, is complete.

Figure 12B:
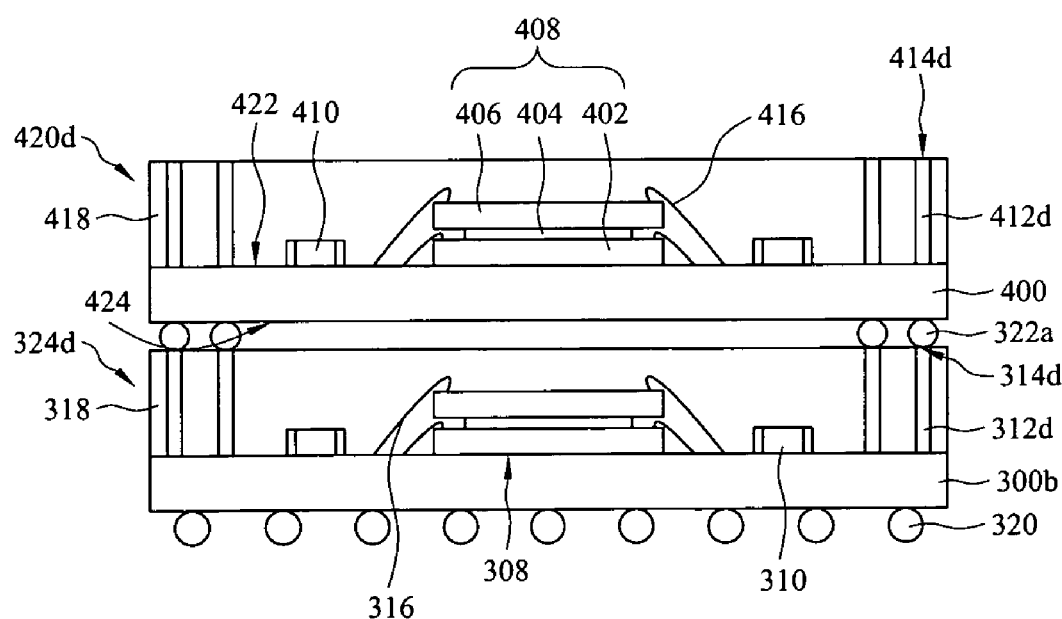
FIGS. 12b and 12c are cross-sectional views of a stacked package structure in accordance with a fourth preferred embodiment of the present invention.

In the other embodiments of the present invention, various types of electrical connection devices or any combination of these electrical connection devices, such as electrical connection devices 412b of the chip package structure 420b (such as shown in FIG. 10a), electrical connection devices 412d of the chip package structure 420d (such as shown in FIG. 12a) and the combination of electrical connection devices 412c and the electrical connection devices 430 of the chip package structure 420c (such as shown in FIG. 11a), may be used, in which a contact 434 and a contact 436 of the electrical connection devices 430 are respectively located at a top end 432 and a bottom end of the electrical connection devices 430, and the contact 434 at the top end 432 of the electrical connection devices 430 is exposed. In the embodiments, the top end 414b of each electrical connection device 412b, the top end 414c of each electrical connection device 412c, and the top end 414d of each electrical connection device 412d are exposed. Accordingly, except the stacked structure shown in FIG. 9a, the stacked package structure of the present invention can be the structure such as shown in FIGS. 10a, 11a or 12b.

Figure 9B:
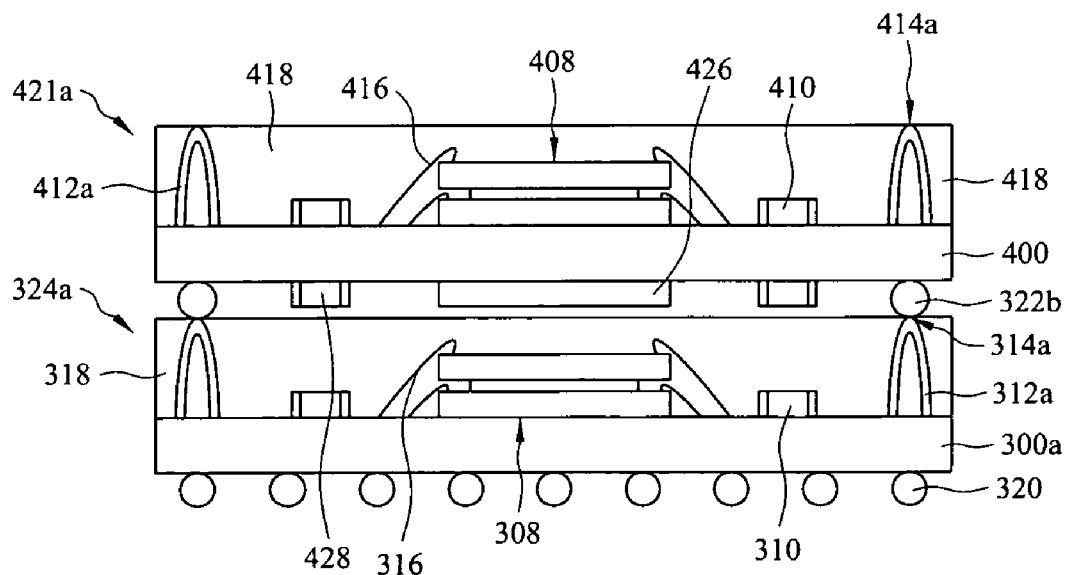
Figure 10B:
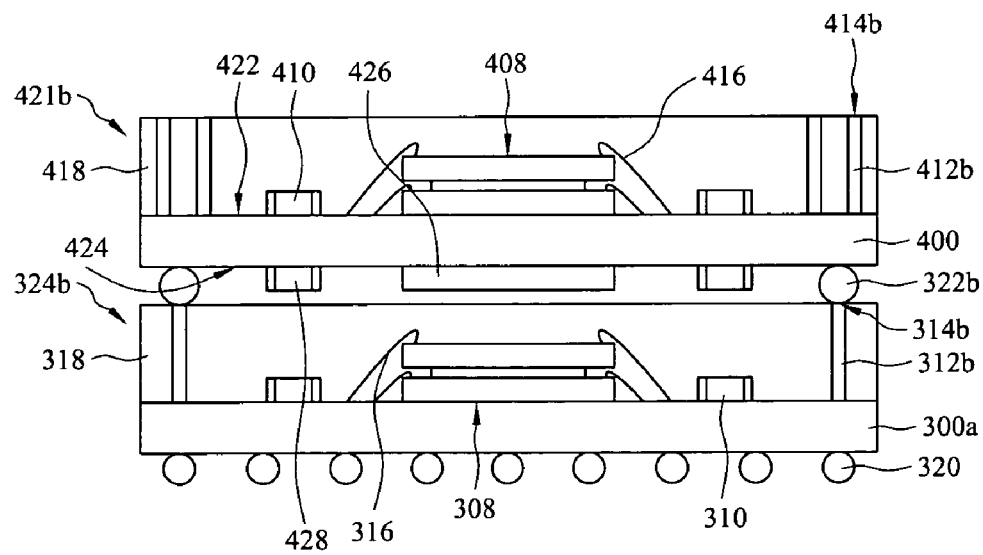
Figure 11B:
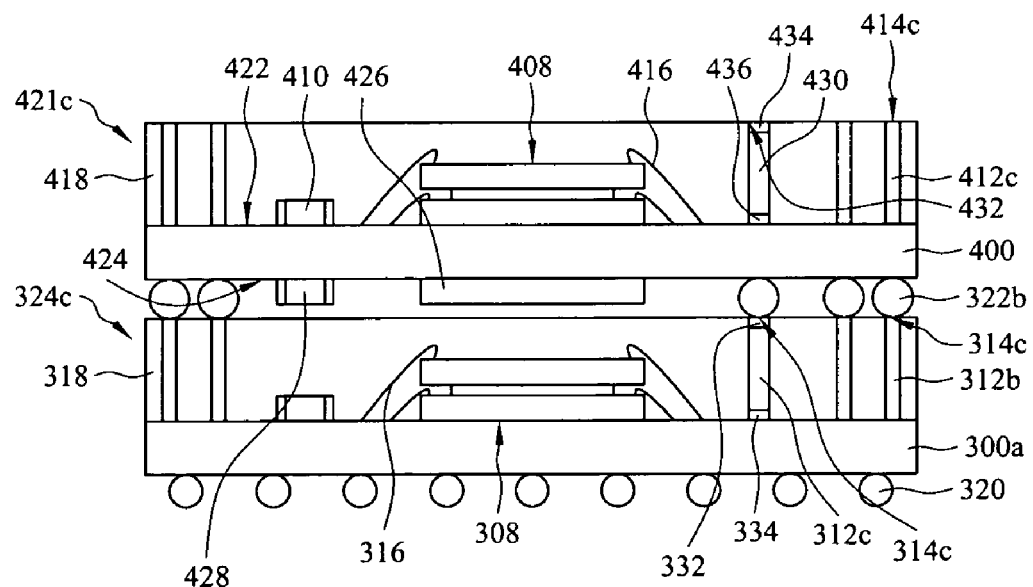
Figure 12C:
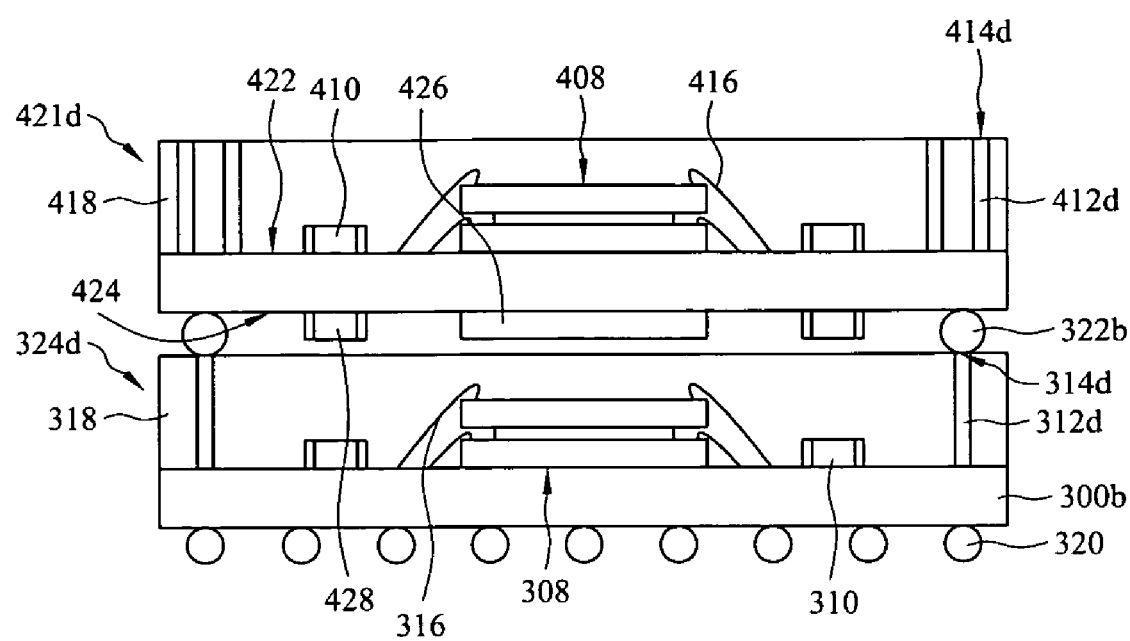

In the stacked package structure of the present invention, a chip 426 and passive devices 428 can be further set on the surface 424 of the substrate 400, and connection bumps 322b larger than the connection bumps 322a are used and the height of the connection bumps 322b is larger than that of the chip 426, so as to prevent the chip 426 and the passive devices 428 from contacting the underlying chip package structure. In the embodiments, a chip package structure 421a such as shown in FIG. 9b, a chip package structure 421b such as shown in FIG. 10b, a chip package structure 421c such as shown in FIG. 11b, and a chip package structure 421d such as shown in FIG. 12c can be formed.

In some embodiment of the present invention, the encapsulant 318 may be formed by using a mold, wherein the mold includes a plurality of pillars corresponding to the connection pads on the substrate 300a. After the encapsulant material is filled and hardened, the encapsulant 318 is formed with a plurality of openings therein and the connection pads on the substrate 300a are exposed by the openings. Then, a conductive material is fill into the openings, and the electrical connection devices are respectively formed in the openings to connect with the exposed connection pads on the substrate 300a. In the other embodiment of the present invention, an encapsulant material layer is firstly formed on the substrate 300a by, for example, a molding or coating method. Then, the encapsulant material layer is drilled to form a plurality of openings in the encapsulant material layer, wherein the openings expose the connection pads on the substrate 300a. Subsequently, a conductive material is fill into the openings, and the electrical connection devices are respectively formed in the openings to connect with the exposed connection pads on the substrate 300a.

According to the aforementioned exemplary embodiments, it is known that a greater portion of the room between the substrates of the two chip package structures has been filled with encapsulant materials, so that the room between the two chip package structures is greatly decreased. Accordingly, in the stack process of the two chip package structures, the warpage can be prevented from occurring in the chip package structures, to avoid cold joint from arising between the chip package structures.

Each stacked package structures disclosed in the aforementioned embodiments is a two-chip stacked package structure, however, it should be noted that the stacked package structure of the present invention may be a stacked package structure including more than two chips, and the present invention is not limited thereto.

According to the aforementioned description, one advantage of the present invention is that the application of the present stacked package structure can decrease the area of the package structure, so the area of the printed circuit board can be greatly reduced.

According to the aforementioned description, another advantage of the present invention is that the application of the present method can integrate the connection between an upper chip package structure and a bottom chip package structure, effectively avoid the warpage from occurring, prevent a cold joint condition from arising between two chip package structures, and greatly enhance the yield of the stacked package process.

As is understood by a person skilled in the art, the foregoing preferred embodiments of the present invention are illustrated of the present invention rather than limiting of the present invention. It is intended to cover various modifications and similar arrangements included within the spirit and scope of the appended claims, the scope of which should be accorded the broadest interpretation so as to encompass all such modifications and similar structure.

What is claimed is:

1. A stacked package structure, comprising:
a first chip package structure comprising:
a first substrate having a first surface and a second surface in opposition to each other;
at least one first chip deposed on and electrically connected to the first surface of the first substrate;
a plurality of first electrical connection devices directly attached to the first surface and periphery of the first substrate, wherein each first electrical connection device is higher than the at least one first chip in altitude, and the first electrical connection devices are a plurality of passive devices;
a first encapsulant covering the first surface of the first substrate, the at least one first chip and the first electrical connection devices, wherein a top end of each first electrical connection device is exposed at a surface of the first encapsulant; and
a plurality of first connections deposed on the second surface of the first substrate, wherein the at least one first chip and the first electrical connection devices are electrically connected to the first connections respectively;
a second chip package structure stacked on the first chip package structure, and the second chip package structure comprising:
a second substrate having a first surface and a second surface in opposition to each other;
at least one second chip deposed on the first surface of the second substrate; and
a second encapsulant covering the first surface of the second substrate and the at least one second chip; and
a plurality of second connections respectively deposed on the top end of each first electrical connection device, and jointed with the second surface of the second substrate, wherein the at least one second chip is electrically connected to the second connections respectively.

2. The stacked package structure according to claim 1, wherein the second chip package structure further comprises a third chip deposed on the second surface of the second substrate.

3. The stacked package structure according to claim 2, wherein a height of each second connection is larger than that of the third chip.

4. The stacked package structure according to claim 1, wherein the second chip package structure further comprises a heat sink deposed on the second surface of the second substrate.

5. The stacked package structure according to claim 1, wherein the first electrical connection devices deposed around the at least one first chip.

6. The stacked package structure according to claim 1, wherein the first chip package structure has the same size as the second chip package structure.

7. A package structure, comprising:
    a substrate having a first surface and a second surface in opposition to each other;
    at least one chip deposed on and electrically connected to the first surface of the substrate;
    a plurality of electrical connection devices directly attached to the first surface and periphery of the substrate, wherein each electrical connection device is higher than the at least one chip in altitude, and the first electrical connection devices are a plurality of passive devices; and
    an encapsulant covering the first surface of the substrate, the at least one chip and the electrical connection devices, wherein a top end of each electrical connection device is exposed at a surface of the encapsulant.

8. The package structure according to claim 7, wherein the substrate further comprises a heat sink deposed on the second surface of the substrate.

9. The package structure according to claim 7, wherein the electrical connection devices are deposed around the at least one chip.

10. The package structure according to claim 7, further comprising an electrical component deposed on the package structure, wherein the electrical component is electrically connected to parts of the top ends of the electrical connection devices.

* * * * *